United States Patent
Ivanov

(10) Patent No.: US 6,667,631 B2
(45) Date of Patent: Dec. 23, 2003

(54) HIGH TEMPERATURE PROBE CARD

(75) Inventor: Ivan E. Ivanov, Phoenix, AZ (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/034,624

(22) Filed: Dec. 27, 2001

(65) Prior Publication Data

US 2003/0146770 A1 Aug. 7, 2003

(51) Int. Cl.[7] ............................................... G01R 31/02
(52) U.S. Cl. ...................... 324/762; 324/760; 324/754
(58) Field of Search .................. 324/754–758, 324/760–762, 765; 165/80.1, 80.2, 80.3, 104.33; 361/697, 701, 702; 257/712, 720, 722

(56) References Cited

U.S. PATENT DOCUMENTS

| | | | |
|---|---|---|---|
| 4,906,920 A | 3/1990 | Huff et al. | 324/158 |
| 5,123,850 A * | 6/1992 | Elder et al. | 439/67 |
| 5,187,431 A | 2/1993 | Libretti | 324/158 |
| 6,043,671 A | 3/2000 | Mizuta | 324/765 |
| 6,081,110 A * | 6/2000 | Moore et al. | 324/158.1 |
| 6,119,460 A * | 9/2000 | Huang | 62/3.3 |
| 6,181,145 B1 | 1/2001 | Tomita et al. | 324/754 |
| 6,246,251 B1 | 6/2001 | Gallagher | 324/765 |
| 6,265,888 B1 | 7/2001 | Hsu | 324/760 |
| 6,277,218 B1 | 8/2001 | Tai et al. | 148/516 |
| 6,292,003 B1 | 9/2001 | Fredrickson et al. | 324/754 |
| 6,307,386 B1 | 10/2001 | Fowler et al. | 324/754 |

* cited by examiner

*Primary Examiner*—Kamand Cuneo
*Assistant Examiner*—Russell M. Kobert
(74) *Attorney, Agent, or Firm*—Lisa K. Jorgenson; Christopher F. Regan

(57) ABSTRACT

The probe card of the present invention permits testing of a semiconductor device-under-test under high temperatures and includes a plurality of printed circuit boards stacked together to form a probe interface board having a top surface and a lower testing face. A heat sink is mounted on the probe interface board at the top surface and extends to the lower testing face. A needle supporting module is carried by the heat sink at the lower testing face and has a plurality of probe needles for electrically connecting to electrical contacts of a semiconductor device-under-test.

32 Claims, 2 Drawing Sheets

HIGH TEMPERATURE PROBE CARD

FIELD OF THE INVENTION

This invention relates to the field of probe cards used for testing a semiconductor device-under-test, such as an integrated circuit (IC) device, including a semiconductor wafer, and more particularly, this invention relates to a probe card that can withstand high temperatures when testing a semiconductor device-under-test.

BACKGROUND OF THE INVENTION

Probe cards are used in the semiconductor manufacturing process when a semiconductor device-under-test, such as a semiconductor wafer, is tested in an Electrical Wafer Sort (EWS) test, a Final Test (FT), or other similar testing procedure. Throughout the following description, the term "Device-Under-Test" (DUT) is a common term and refers equally to the probe testing of dice during the Electrical-Wafer-Sort (EWS) or wafer probe or to the testing of an assembled or packaged dice or device during the Final Test (FT).

Many different probe cards are commercially available for use with different fixtures and testing systems. An example is disclosed in commonly assigned U.S. Pat. No. 5,187,431 to Libretti, issued Feb. 16, 1993, the disclosure which is hereby incorporated by reference in its entirety. Other probe cards and testing devices as representative examples are disclosed in U.S. Pat. Nos. 6,277,218; 4,906,920; and 6,181,145.

Greater numbers of CMOS and BiCMOS semiconductor devices are now providing customers a wide range of device usages. The increased use of these technologies include their use in the telecommunication and automotive industries under extreme conditions at very high and very low temperatures. Therefore, the Electrical Wafer Sort and Final Tests must guarantee device functionality at these extreme temperature ranges.

Many probe cards currently in use provide stacked printed circuit boards that form a probe interface board, having a lower testing face that carries a probe needle module ("spider"), having a large number of probe needles that electrically connect to electrical contacts (bond pads) of a semiconductor device-under-test (die). The probe interface board has various testing components mounted on the board, such as on its top surface. Typically, these probe cards have good performance in a standard EWS testing temperature range from about 25° C. to about 70–80° C. Modern car engine controls and microcontrollers, on the other hand, as commonly used in telecommunication and some automotive applications, have operating temperature ranges that occur above 130° C. Thus, a normal prior art probe card will be subject to overheat and thermal expansions and contractions. As a result, this probe card would be subject to printed circuit board misplanarity, probe tip misplanarity, probe needle misplanarity, defects in the printed circuit board layer stack, and defects in mounted components on the printed circuit board forming the probe interface board.

Some of these defects, such as probe tip and needle misplanarity, are recoverable, even though recovery may take a large amount of time and human resources to correct the resulting problems. Some of the defects, however, are unrecoverable defects, including the permanent deformation of the printed circuit board and broken or shorted printed circuit board internal layers.

SUMMARY OF THE INVENTION

It is therefore an object of the present invention to provide a high temperature probe-card that withstands high temperatures and temperature variations for testing of a semiconductor device-under-test, which overcomes the drawbacks as identified above.

The present invention is advantageous and provides a probe card for testing a semiconductor dice-under-test on semiconductor wafers, which allows use of the probe card at extremely high wafer probe temperatures and maintains the wafer probe process on the same levels as for wafer probing at temperatures under 70–80° C. The present invention allows stable and reliable wafer probing at very high wafer probe temperatures, up to about 180° C. to about 200° C. by eliminating and minimizing heat impacts such as thermal deformations.

The present invention advantageously allows a gain in tester output capacity, tester time, and tester resources. The increased temperatures at which the probe card is usable also provides reliable wafer probing at around 180° C. to about 200° C., which is important for various semiconductor devices in automotive, telecommunication and military applications. The probe card of the present invention also provides increased planarity stability for probe needles at higher probe temperatures and increased co-planarity of the probe tips. The present invention provides extension of the probe capabilities of EWS testing departments with minimal investment.

The probe card of the present invention allows testing of semiconductor dice-under-test. A plurality of printed circuit boards are stacked together to form a probe interface board having a top surface and lower testing face. A heat sink is mounted on the probe interface board at the top surface and extends to the lower testing face. A needle supporting module is carried by the heat sink at the lower testing face and includes a plurality of probe needles for electrically connecting to electrical contacts of a semiconductor device-under-test.

In one aspect of the invention, the needle supporting module is formed from a thermally conducting ceramic material. The lower testing face on the probe interface board includes electrical contacts for interfacing with testing components carried by the probe interface board and an electrical connector extending from the electrical contacts to the needle supporting module for electrically connecting the probe needle to testing components carried by the probe interface board.

In yet another aspect of the present invention, the probe interface board is formed to have a central opening and edge defined by the central opening. The heat sink extends along the edge and around onto the lower testing face. The central opening can be substantially rectangularly configured. The heat sink also includes an outer portion, a central portion engaging the edge defined by the central portion, and at least one radial arm extending from the outer portion to the central portion. A mount is formed within the heat sink on the portion that extends around the lower testing face under which the needle supporting module mounts. The heat sink is formed of a metallic material and can be formed by one of copper or steel.

In yet another aspect of the present invention, at least one copper layer is positioned within the probe interface board and engages the heat sink to accumulate heat within the probe interface board and transfer heat to the heat sink. The upper layer also provides internal support to the probe interface board. The copper layer can be formed as two, spaced copper layers positioned within the probe interface board between various printed circuit board layers forming the probe interface board. Each copper layer is electrically insulated as having no electrical interconnection to any electrical components of a printed circuit board forming the probe interface board. A copper layer is preferably formed to have at least twice the thickness as a printed circuit board forming the probe interface board.

In yet another aspect of the present invention, a probe card is provided for testing a semiconductor device-under-test and includes a plurality of printed circuit boards stacked together to form a probe interface board having a top surface, a central opening defining an edge, and a lower testing face. A heat sink is mounted on the probe interface at the top surface and extends along the edge defined by the central opening to the lower testing face. At least one copper layer is positioned within the probe interface board and engages the heat sink to accumulate heat within the probe interface board and transfer heat to the heat sink and provide internal support to the probe interface board. A needle supporting module is carried by the heat sink and has a plurality of probe needles for electrically connecting to electrical contacts of a semiconductor device-under-test.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention advantageously allows probe card testing at temperatures above 130° C., including a temperature range from about 180° C. to as high as about 200° C., and even higher under some circumstances, by eliminating and minimizing heat impacts as thermal deformations. The probe card is advantageous in the production of many different types of semiconductors, including CMOS and BiCMOS semiconductors used in telecommunication and automotive applications that operate at extreme temperature conditions. Therefore, the Electrical Wafer Sort test and Final Tests that are used for guarantying device functionality at these temperature ranges will be sufficient and operable for testing.

The present invention overcomes the problems associated with common prior art probe cards that are not operable at higher temperatures because the overheat and thermal expansions and contractions cause printed circuit board misplanarity, probe tip misplanarity, probe needle misplanarity, defects in the printed circuit board layer stack forming a probe interface board, and defects in mounted components on the printed circuit board.

The present invention provides successful wafer probing at temperature ranges of at least about 180° C. to about 200° C. (and higher) and a gain resulting in extra tester output capacity, and efficient tester time and tester resources. Reliable wafer probing thus occurs at ultra high temperatures from up to about 180° C. to about 200° C., which is important for semiconductor products used in many automotive, telecommunication and military applications. Greater planarity of the probe needles and greater co-planarity of probe tips occurs at these temperatures. The probe card capabilities can be extended in EWS departments of various manufacturing establishments with minimal investments.

Figure 1:
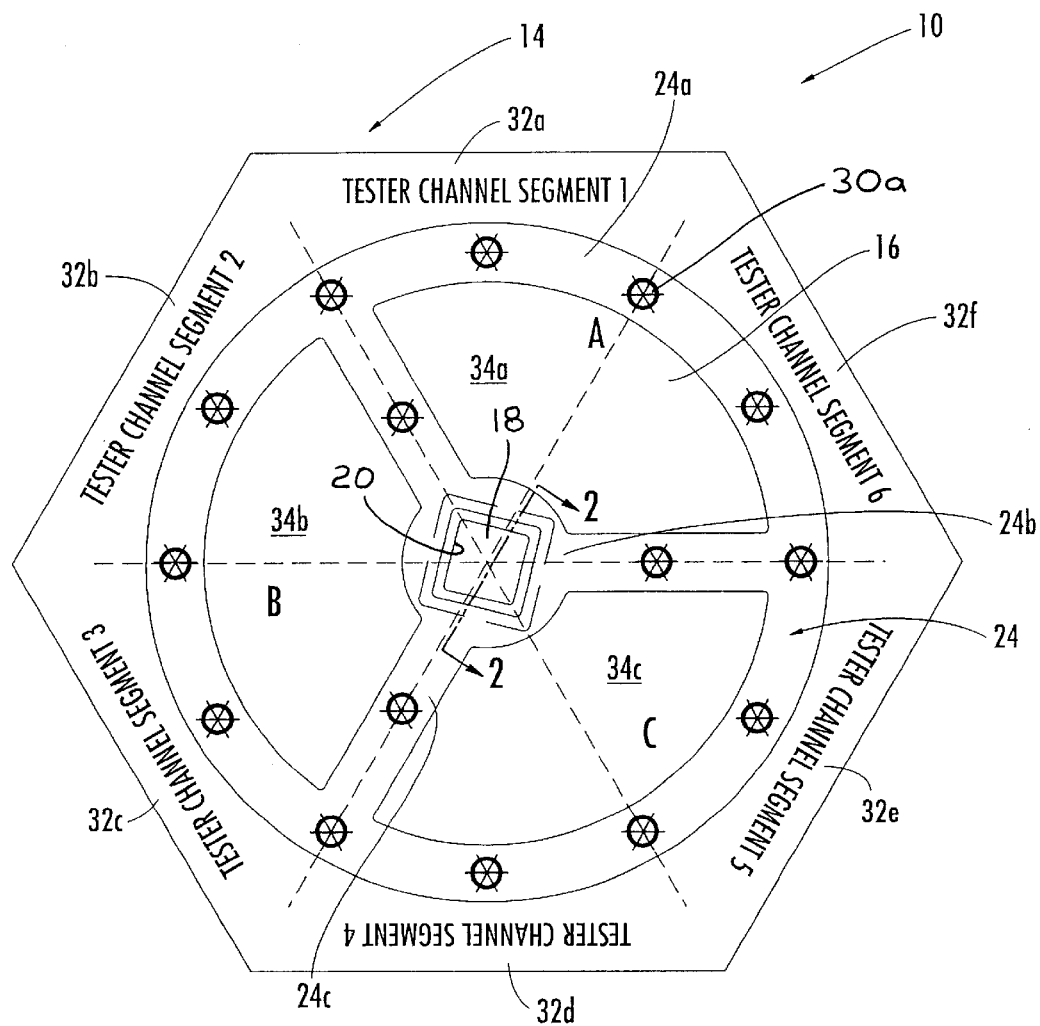
FIG. 1 is a plan view of the probe card of the present invention.
Figure 2:
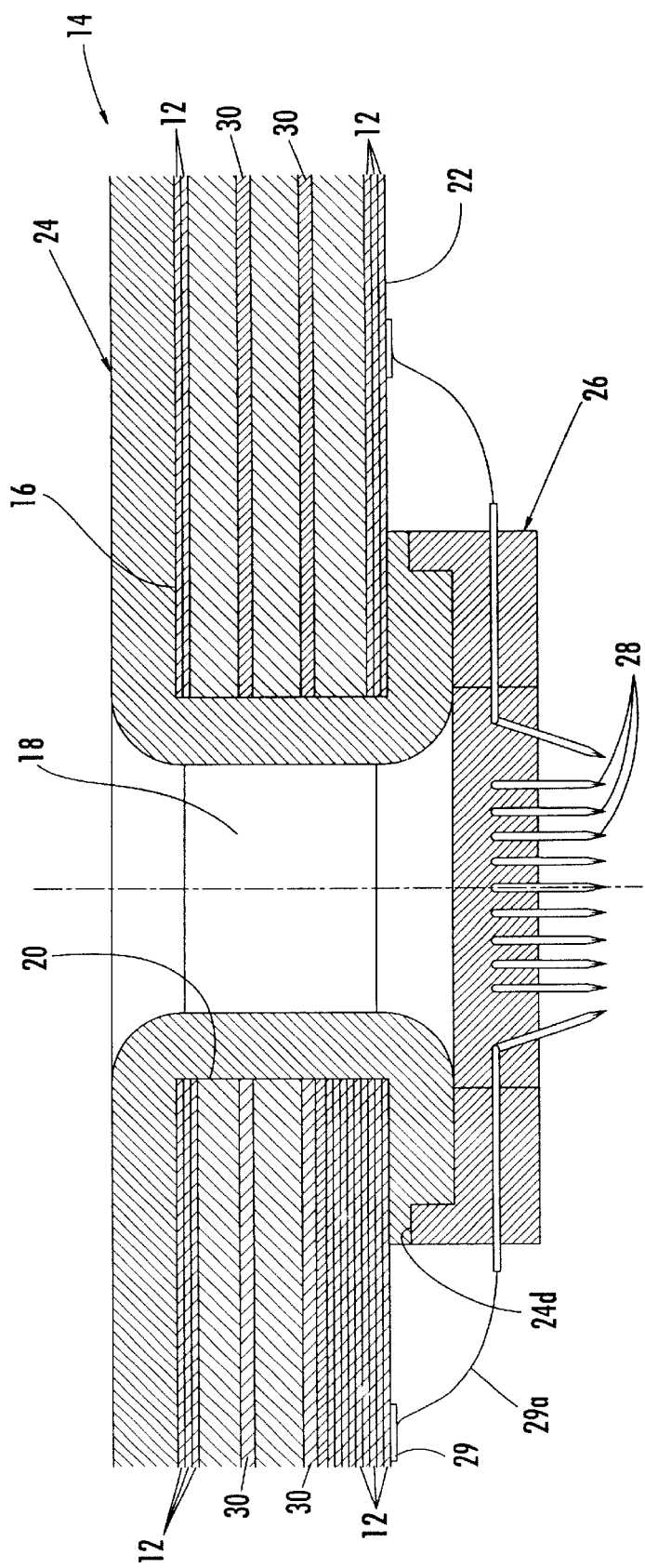
FIG. 2 is a sectional view taken along line 2—2 of FIG. 1.

Referring now to FIG. 1 and the partial sectional view shown in FIG. 2, there is illustrated a probe card 10 of the present invention. The probe card 10 is formed from a plurality of printed circuit boards 12 that are stacked together to form a probe interface board, indicated generally at 14. The printed circuit boards 12 can be formed by known manufacturing techniques used for probe cards, as known to those skilled in the art, forming a high temperature resistant probe card. The probe interface board 14 has a top surface 16, a central opening 18 that defines an inner board edge 20 and a lower testing face 22. As shown in FIG. 1, the central opening 18 is substantially rectangular configured in one non-limiting illustrated example, and the probe interface board 14 is geometrically configured having six sides, although a different geometrical configuration could be used depending on testing application and end use.

A heat sink 24 is mounted on the probe interface board 14 at the top surface 16 and extends along the inner board edge 20 to the lower testing face 22 and partially along that surface as shown in FIG. 2. A needle supporting module 26 is carried by the heat sink 24 and includes a plurality of probe needles 28 for electrically connecting to electrical contacts of a semiconductor device-under-test, such as a semiconductor wafer. The probe needles are typically formed from tungsten or other material as known to those skilled in the art and can be connected to probe needle circuit contained in the needle supporting module. Probe needles 28 interconnect to bond pads 29 on the lower testing face 22 via electrical wires 29a or other circuit connection techniques known to those skilled in the art. As is well known, during a testing procedure, the probe needles are brought into contact (a touchdown) with bonding pads or other electrical connections of a device-under-test. Testing then proceeds. The probe card 10 could also be interchangeable with other probe cards and be formed as part of a testing device or system, as known to those skilled in the art.

As shown in FIG. 1, the heat sink 24 includes an outer portion 24a, which could be circular configured as illustrated, a central portion 24b engaging the inner board edge 20 defined by the central opening 18, and at least one radial arm 24c extending from the outer portion 24a to the central portion 24b. Fasteners, as known to those skilled in the art, can be used to fasten the heat sink to the top surface of the probe interface board.

As illustrated, the heat sink 24 extends around the inner board edge 20 and partially onto the lower testing face. The heat sink 24 includes a module mount 24d formed as a notch that extends along the heat sink on the portion engaging the lower testing face. The needle supporting module 26 is mounted and fits on this notch. The heat sink 24 is preferably formed from a metallic material, which could include a material, such as copper or steel, or other heat sink material known to those skilled in the art. The heat sink also provides mechanical support to the printed circuit board layers 12 forming the probe interface board 14 and provides mechanical support to the needle supporting module 26. In one aspect of the invention, there is no mechanical connection between the needle supporting-module 26 and the printed circuit board layers 12 forming the probe interface board. This prevents any impact caused by a printed circuit board deformation to carry onto the needle supporting module and damage probe tips and probe needles. Accumulated heat in the needle supporting module 26 is dissipated by the heat sink 24. Thus, there is a more permanent temperature stability for the needle supporting module 26, which assists in guarantying a permanent length of the probe needle, while decreasing the chance of probe tip misalignments. As explained before, the probe tips are electrically connected to electrical interconnects or pads 29 on the printed circuit board by wire interconnects or other wire connections 29a.

As shown in FIG. 2, at least one copper layer 30 is positioned within the probe interface board between two layers of printed circuit board 14. The copper layer 30 engages the heat sink 24 to accumulate heat within the probe interface board 14 and transfer heat to the heat sink and provide internal support to the probe interface board. As illustrated, two spaced copper layers 30 are positioned within the probe interface board and terminate at the inner board edge 20 and engage the heat sink 30. Each copper layer 30 is electrically insulated as having no electrical interconnection to any electrical components of a printed circuit board 12 forming the probe interface board 14. Each copper layer 30 is formed in one embodiment to have preferably at least twice the thickness as a printed circuit board forming the probe interface board, resulting in sufficient rigidity and strength. These copper layers 30 are also termed "copper arming layers" (CAL) and act as a thermal shield to prevent thermal deformations and printed circuit board misplanarity. The copper layers 30 also protect any electronic components mounted on the top surface 16 of the printed circuit board from overheat caused by high temperature wafer chuck. Thus, the temperature difference between the surface of the high temperature wafer chuck and the top component layer of the printed circuit board can exceed up to about 100° C. The copper layers 30 can be mechanically connected to the heat sink 24 by screws 30a as shown in FIG. 1, where the screws 30a extend into the printed circuit boards and engage the copper heat sinks.

As shown in FIG. 1, the six-sided configuration as illustrated has six different groups of tester channels 32a–f and three different component mounting areas 32a–c on the probe interface board as labeled A, B and C. Different testing components can be mounted on the component mounting areas as known to those skilled in the art.

An example of an automotive application for the probe card of the present invention could include a probe card layout as illustrated and tester channel assignments as set forth below as a non-limiting example:

| Probe Card Layout and Tester Channel Assignments | | | | | | |
|---|---|---|---|---|---|---|
| Pin | Die Pad | Tester | Pad Coordinates | | Pin | |
| NAME | Pin | Channel | X = | Y = | Type | Pin Description |
| VSSE | 1 | VSSE | 75 | 7160 | G | Digital Ground |
| SHIN2 | 2 | 91 | 75 | 6905 | AI | Analog Input |
| N.C. | 3 | N.C. | | | NC | Not Connected |
| SHOUT2 | 4 | 92 | 75 | 6475 | AI | Sample/Hold Output |
| VSSA | 5 | VSSA | 75 | 6260 | G | Analog Ground |
| VDDI | 6 | CSO | 75 | 6045 | P | Digital Power Supply +5 V |
| VSSI | 7 | VSSI | 75 | 5830 | G | Digital Ground |
| CAM | 8 | 94 | 75 | 5615 | I | Cam Input |
| CRANK | 9 | 95 | 75 | 5400 | I | Crank Input |
| KW | 10 | 32 | 75 | 5185 | O | Knock Window Output |
| KCLK | 11 | 33 | 75 | 4970 | O | Knock Window Clock Output |
| TACH | 12 | 34 | 75 | 4755 | O | Tachometer Output |
| QADCT | 13 | 35 | 75 | 4540 | O | QADC Trigger Output |
| OSSPD | 14 | 36 | 75 | 4325 | I | Output Shaft Speed Input |
| VEHSPD | 15 | 37 | 75 | 4110 | I | Vehicle Speed Input |
| VDDI | 16 | VSO | 75 | 3895 | P | Digital Power Supply +5 V |
| VSSI | 17 | VSSI | 75 | 3680 | G | Digital Ground |
| GPIO0 | 18 | 96 | 75 | 3465 | B | General Purpose I/O |
| GPIO1 | 19 | 97 | 75 | 3250 | B | General Purpose I/O |
| GPIO2 | 20 | 98 | 75 | 3035 | B | General Purpose I/O |
| GPIO3 | 21 | 99 | 75 | 2820 | B | General Purpose I/O |
| GPIO4 | 22 | 100 | 75 | 2605 | B | General Purpose I/O |
| GPIO5 | 23 | 101 | 75 | 2390 | B | General Purpose I/O |
| GPIO6 | 24 | 102 | 75 | 2175 | B | General Purpose I/O |
| GPIO7 | 25 | 103 | 75 | 1960 | B | General Purpose I/O |
| VDDI | 26 | VSO | 75 | 1745 | P | Digital Power Supply +5 V |
| VSSI | 27 | VSSI | 75 | 1530 | G | Digital Ground |
| VPWO | 28 | 40 | 75 | 1315 | O/ODP | OD PCMOS Output |
| VPWIB | 29 | 41 | 75 | 1100 | I | Digital Input |
| QSCITX | 30 | 42 | 75 | 885 | O/ODN | OD NCMOS Output |
| QSCIRX | 31 | 43 | 75 | 670 | I | Digital Input |
| VDDE | 32 | VSI | 75 | 420 | P | Digital Power Supply |
| VSSI | 33 | VSSE | 420 | 75 | G | Digital Ground |
| A11 | 34 | 105 | 670 | 75 | I3 | Digital Input 3.3 V |
| A10 | 35 | 106 | 885 | 75 | I3 | Digital Input 3.3 V |
| A9 | 36 | 107 | 1100 | 75 | I3 | Digital Input 3.3 V |
| A8 | 37 | 108 | 1315 | 75 | I3 | Digital Input 3.3 V |
| A7 | 38 | 109 | 1530 | 75 | I3 | Digital Input 3.3 V |

-continued

| | | | | | | |
|---|---|---|---|---|---|---|
| A6 | 39 | 110 | 1745 | 75 | I3 | Digital Input 3.3 V |
| A5 | 40 | 111 | 1960 | 75 | I3 | Digital Input 3.3 V |
| A4 | 41 | 48 | 2175 | 75 | I3 | Digital Input 3.3 V |
| A3 | 42 | 49 | 2390 | 75 | I3 | Digital Input 3.3 V |
| A2 | 43 | 50 | 2605 | 75 | I3 | Digital Input 3.3 V |
| A1 | 44 | 51 | 2820 | 75 | I3 | Digital Input 3.3 V |
| VDDE | 45 | VSI | 3035 | 75 | P | Digital Power Supply |
| VSSE | 46 | VSSE | 3250 | 75 | G | Digital Ground |
| D0 | 47 | 52 | 3465 | 75 | BM | Data Bus/Scan Out |
| D1 | 48 | 53 | 3680 | 75 | BM | Data Bus/Scan Out |
| D2 | 49 | 54 | 3895 | 75 | BM | Data Bus |
| D3 | 50 | 55 | 4110 | 75 | BM | Data Bus/Scan Out |
| D4 | 51 | 112 | 4325 | 75 | BM | Data Bus/Scan Out |
| D5 | 52 | 113 | 4540 | 75 | BM | Data Bus/Scan Out |
| D6 | 53 | 114 | 4755 | 75 | BM | Data Bus/Scan Out |
| D7 | 54 | 115 | 4970 | 75 | BM | Data Bus/Scan Out |
| D8 | 55 | 116 | 5158 | 75 | BM | Data Bus/Scan Out |
| D9 | 56 | 117 | 5400 | 75 | BM | Data Bus/Scan Out |
| D10 | 57 | 118 | 5615 | 75 | BM | Data Bus |
| D11 | 58 | 119 | 5830 | 75 | BM | Data Bus |
| D12 | 59 | 56 | 6045 | 75 | BM | Data Bus |
| D13 | 60 | 57 | 6260 | 75 | BM | Data Bus |
| D14 | 61 | 58 | 6475 | 75 | BM | Data Bus |
| D15 | 62 | 59 | 6690 | 75 | BM | Data Bus |
| CLK | 63 | 60 | 6905 | 75 | I3 | Digital Input 3.3 V |
| VDDE | 64 | VSI | 7161 | 75 | P | Digital Power Supply |
| VSSE | 65 | VSSE | 7506 | 420 | G | Digital Ground |
| RWB | 66 | 61 | 7506 | 670 | I3 | Digital Input 3.3 V |
| CSD | 67 | 62 | 7506 | 885 | I3 | Digital Input 3.3 V |
| CSSB | 68 | 63 | 7506 | 1100 | I3 | Digital Input 3.3 V |
| RSTB | 69 | 7 | 7506 | 1315 | I3 | Digital Input 3.3 V |
| VDDI | 70 | VSO | 7506 | 1530 | P | Digital Power Supply +5 V |
| VSSI | 71 | VSSI | 7506 | 1745 | G | Digital Ground |
| FCRANK | 72 | 6 | 7506 | 1960 | O | Digital Output |
| IRQB | 73 | 66 | 7506 | 2175 | O | Digital Output |
| IGN1 | 74 | 0 | 7506 | 2390 | B | Ignition Output/GPIO |
| IGN2 | 75 | 1 | 7506 | 2605 | B | Ignition Output/GPIO |
| IGN3 | 76 | 2 | 7506 | 2820 | B | Ignition Output/GPIO |
| IGN4 | 77 | 3 | 7506 | 3035 | B | Ignition Output/GPIO |
| IGN5 | 78 | 4 | 7506 | 3250 | B | Ignition Output/GPIO |
| IGN6 | 79 | 5 | 7506 | 3465 | B | Ignition Output/GPIO |
| VDDI | 80 | VSO | 7506 | 3680 | P | Digital Power Supply +5 V |
| N.C. | 81 | N.C. | 7506 | 3895 | NC | Not Connected |
| IGN7 | 82 | 64 | 7506 | 4110 | B | Ignition Output/GPIO |
| IGN8 | 83 | 65 | 7506 | 4325 | B | Ignition Output/GPIO |
| N.C. | 84 | N.C. | | | NC | Not Connected |
| LBE | 85 | 67 | 7506 | 4755 | ODN | OD NCMOS Output |
| INJ1 | 86 | 68 | 7506 | 4970 | B | Injector Output/GPIO |
| INJ2 | 87 | 69 | 7506 | 5185 | B | Injector Output/GPIO |
| INJ3 | 88 | 70 | 7506 | 5400 | B | Injector Output/GPIO |
| INJ4 | 89 | 71 | 7506 | 5615 | B | Injector Output/GPIO |
| VDDI | 90 | VSO | 7506 | 5830 | P | Digital Power Supply +5 V |
| VSSI | 91 | VSSI | 7506 | 6045 | G | Digital Ground |
| INJ5 | 92 | 8 | 7506 | 6260 | B | Injector Output/GPIO |
| INJ6 | 93 | 9 | 7506 | 6475 | B | Injector Output/GPIO |
| INJ7 | 94 | 10 | 7506 | 6990 | B | Injector Output/GPIO |
| INJ8 | 95 | 11 | 7506 | 6905 | B | Injector Output/GPIO |
| VDDE | 96 | VSI | 7506 | 7160 | P | Digital Power Supply |
| VSSE | 97 | VSSE | 7161 | 7505 | G | Digital Ground |
| INJ9 | 98 | 72 | 6905 | 7505 | B | Injector Output/GPIO |
| INJ10 | 99 | 73 | 6690 | 7505 | B | Injector Output/GPIO |
| INJFBK | 100 | 74 | 6475 | 7505 | I | Digital Input |
| PB0 | 101 | 75 | 6260 | 7505 | B | Edge Detect Input |
| PB1 | 102 | 76 | 6045 | 7505 | B | Edge Detect Input |
| PB2 | 103 | 77 | 5830 | 7505 | B | Edge Detect Input |
| PB3 | 104 | 78 | 5615 | 7505 | B | Edge Detect Input |
| PB4 | 105 | 79 | 5400 | 7505 | B | Edge Detect Input |
| PB5 | 106 | 16 | 5185 | 7505 | B | Edge Detect Input |
| PB6 | 107 | 17 | 4970 | 7505 | B | Edge Detect Input |
| PB7 | 108 | 18 | 4755 | 7505 | B | Edge Detect Input |
| AD0 | 109 | 19 | 4540 | 7505 | B | Mux'd Addresses/Data Output |
| AD1 | 110 | 20 | 4325 | 7505 | B | Mux'd Addresses/Data Output |
| AD2 | 111 | 21 | 4110 | 7505 | B | Mux'd Addresses/Data Output |
| VDE | 112 | VSI | 3895 | 7505 | P | Digital Power Supply |
| VSSE | 113 | VSSE | 3680 | 7505 | G | Digital Ground |
| AD3 | 114 | 80 | 3465 | 7505 | B | Mux'd Addresses/Data |

-continued

| | | | | | | |
|---|---|---|---|---|---|---|
| AD4 | 115 | 81 | 3250 | 7505 | B | Output Mux'd Addresses/Data Output |
| AD5 | 116 | 82 | 3035 | 7505 | B | Mux'd Addresses/Data Output |
| AD6 | 117 | 83 | 2820 | 7505 | B | Mux'd Addresses/Data Output |
| AD7 | 118 | 84 | 2605 | 7505 | B | Mux'd Addresses/Data Output |
| ADSN | 119 | 85 | 2390 | 7505 | O | Digital Output |
| OSCOUT | 120 | 86 | 2175 | 7505 | OSP | Output Standby Power Voltage |
| OSCIN | 121 | 87 | 1960 | 7505 | ISP | Digital Output |
| PNVLD | 122 | 24 | 1745 | 7505 | ISP | Standby Referenced Input |
| VSTBY | 123 | VS3 | 1530 | 7505 | SP | Standby Power |
| SHIN1 | 124 | 25 | 1315 | 7505 | AI | Analog Input |
| VDDA | 125 | VS2 | 1100 | 7505 | AP | Analog Power Supply +5 V |
| SHOUT1 | 126 | 28 | 885 | 7505 | AO | Sample/Hold Output |
| SHT | 127 | 28 | 670 | 7505 | DIA | Digital Input Referenced to Analog Power |
| VDDE | 128 | VS1 | 420 | 7505 | P | Digital Power Supply |
| VDDI | 16 | VS0 | | | | Digital Power Supply +5 V |
| VDDE | 16 | VS1 | | | | Digital Power Supply |
| VDDA | 125 | VS2 | | | | Analog Power Supply +5 V |
| VSTBY | 123 | VS3 | | | | Standby Power |

PIN CODE

| ABBREVIATION | PIN TYPE |
|---|---|
| AG | Analog Ground |
| AI | Analog Input (0–5 Volt) |
| AO | Analog Output (0–5 Volt) |
| AP | Analog Power (5 Volt Supply) |
| B | Digital Bidirectional 5 Volt |
| BM | Digital Bidirectional Mixed 3.3 Volt Input, 5 Volt Output |
| G | Digital Ground |
| I | Digital Input Only with 5 Volt Thresholds |
| I3 | Digital Input Only with 3.3 Volt Thresholds |
| NC | No Connect |
| O | Digital Output 5 Volt |
| ODN | Open Drain NMOS Output |
| ODP | 5 Volt Open Drain PMOS Output |
| P | Digital Power (5 Volt Supply) |
| SP | Standby Power |
| OSP | Output, Standby Power Voltage |
| ISP | Input, referenced to Standby Power |
| DIA | Digital Input, referenced to Analog Power |

In this non-limiting example, there are various decoupling capacitors of 10.0, 1.0 and 0.1 microFarads mounted from each power supply to a relevant ground plane, and mounted from the top side of a printed circuit board to allow a total of 36 capacitors. Various electrically connecting ground planes can be allowed for each power supply, which could be located under relevant signal traces with planes electrically connected together. A non-limiting example of various probe card specifications that can be used are set forth below:

Example of Probe Card Specifications

| Parameter | Value | M.U. |
|---|---|---|
| Probing Temperature | 145 | ° C. |
| Probe Tip Material | Use high temperature and long | >~1000000 |
| Beam Length | 175 | mils |
| PCA Overdrive | <0.5 | mils |
| TIP Depth | 144 +/− 5 from bottom | mils |
| Overdrive | 3 | mils |
| Needle-to-Needle Planarity | 0.2 | mils |
| Probe Card Overtravel Design | 2 | mils |
| Probe Tip Diameter | 1.2 +/− 0.1 | mils |
| Probe Contact Force | 1.5–2.5 | g/mil |
| Probe Needle Bend Angles | 103 +/− 3 | ° |
| Bond Pad Dimensions | 90 × 90 | μm |
| Traces and Channels | Customer assigned | |
| Probes Mounting Ring | Straight inside ring aperture | |
| PCA | | |
| PCA Alignment (with one decimal place) | +/− 0.2 | mils |
| PCA Contact Resistance | <2.0 | ohms |
| PCA Leakage on I/O's | <25 | nA |
| PCA Leakage on Powers and Grounds | <100 | nA |
| Wafer Notch Rotation | 0 | ° |
| Die Size | 292.56 × 292.56 | mils |
| Die Stepping Size | X = 304.736 Y = 304.729 | mils |

Another non-limiting example is the use of the probe card for Final Test of the assembled die in a 168+9 ball grid array (BGA) package, where the probe needle "spider" is replaced with the relevant BGA socket with a 168+9 ball grid array.

It is evident that the present invention provides a high temperature probe card that provides for the testing of a semiconductor device-under-test and allows successful testing at temperatures as high as about 180° C. to about 200° C. and even higher, under some circumstances.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

What is claimed is:

1. A probe card for testing a semiconductor device-under-test comprising:
   a plurality of printed circuit boards stacked together to form a probe interface board having a top surface and lower testing face;
   a heat sink mounted on the probe interface board at the top surface and extending to the lower testing face; and
   a needle supporting module carried by the heat sink at the lower testing face and having a plurality of probe needles for electrically connecting to electrical contacts of a semiconductor device-under-test.

2. A probe card according to claim 1, wherein said needle supporting module further comprises a thermally conducting ceramic material.

3. A probe card according to claim 1, wherein said the lower testing face on the probe interface board further comprises electrical contacts for interfacing with testing components carried by said probe interface board and an electrical connector extending from said electrical contacts to the needle supporting module for electrically connecting probe needles to testing components carried by said probe interface board.

4. A probe card according to claim 1, wherein said probe interface board is formed to have a central opening and edge defined by said central opening along which said heat sink extends around onto said lower testing face.

5. A probe card according to claim 4, wherein said central opening is substantially rectangularly configured.

6. A probe card according to claim 4, wherein said heat sink includes an outer portion, a central portion, and at least one radial arm extending from said outer portion to said central portion.

7. A probe card according to claim 4, and further comprising a mount formed within said heat sink on the portion that extends on said lower testing face onto which said needle supporting module mounts.

8. A probe card according to claim 1, wherein said heat sink is formed of a metallic material.

9. A probe card according to claim 8, wherein said metallic material forming said heat sink comprises one of copper or steel.

10. A probe card for testing a semiconductor device-under-test comprising:
    a plurality of printed circuit boards stacked together to form a probe interface board having a top surface and lower testing face;
    a heat sink mounted on the probe interface board at the top surface and extending to the lower testing face;
    at least one copper layer positioned within said probe interface board and interconnecting said heat sink to accumulate heat within said probe interface board and transfer heat to said heat sink and provide internal support to said probe interface board; and
    a needle supporting module carried by the heat sink at the lower testing face and having a plurality of probe needles for electrically connecting to electrical contacts of a semiconductor device-under-test.

11. A probe card according to claim 10, and further comprising two, spaced copper layers positioned within said probe interface board and interconnecting said heat sink.

12. A probe card according to claim 10, wherein said copper layer is electrically insulated as having no electrical interconnection to any electrical components of a printed circuit board forming said probe interface board.

13. A probe card according to claim 10, wherein said copper layer is formed to have at least twice the thickness as a printed circuit board forming the probe interface board.

14. A probe card according to claim 10, wherein said needle supporting module further comprises a thermally conducting ceramic material.

15. A probe card according to claim 10, wherein said the lower testing face on the probe interface board further comprises electrical contacts for interfacing with testing components carried by said probe interface board and an electrical connector extending from said electrical contacts to the needle supporting module for electrically connecting probe needles to testing components carried by said probe interface board.

16. A probe card according to claim 10, wherein said probe interface board is formed to have a central opening and edge defined by said central opening along which said heat sink extends around onto said lower testing face.

17. A probe card according to claim 16, wherein said central opening is substantially rectangularly configured.

18. A probe card according to claim 16, wherein said heat sink includes an outer portion, a central portion, and at least one radial arm extending from said outer portion to said central portion.

19. A probe card according to claim 16, and further comprising a mount formed within said heat sink on the portion that extends on said lower testing face onto which said needle supporting module mounts.

20. A probe card according to claim 10, wherein said heat sink is formed of a metallic material.

21. A probe card according to claim 10, wherein said metallic material comprises one of copper or steel.

22. A probe card for testing a semiconductor device-under-test comprising:
    a plurality of printed circuit boards stacked together to form a probe interface board having a top surface, a central opening forming an edge, and a lower testing face;
    a heat sink mounted on the probe interface board at the top surface and extending along said edge defined by said central opening to the lower testing face;
    at least one copper layer positioned within said probe interface board and interconnecting said heat sink to accumulate heat within said probe interface board and transfer heat to said heat sink and provide internal support to said probe interface board; and
    a needle supporting module carried by the heat sink at the lower testing face and having a plurality of probe needles for electrically connecting to electrical contacts of a semiconductor device-under-test.

23. A probe card according to claim 22, wherein said central opening is substantially rectangularly configured.

24. A probe card according to claim 22, and further comprising two, spaced copper layers positioned within said probe interface board and interconnecting said heat sink.

25. A probe card according to claim 22, wherein said copper layer is electrically insulated as having no electrical interconnection to any electrical components of a printed circuit board forming said probe interface board.

26. A probe card according to claim 22, wherein said copper layer is formed at least twice the thickness as a printed circuit board forming the probe interface board.

27. A probe card according to claim 22, wherein said needle supporting module further comprises a thermally conducting ceramic material.

28. A probe card according to claim 22, wherein said lower testing face on the probe interface board further comprises electrical contacts for interfacing with testing components carried by said probe interface board and an electrical connector extending from said electrical contacts to the needle supporting module for electrically connecting probe needles to testing components carried by said probe interface board.

29. A probe card according to claim 22, wherein said heat sink includes an outer portion, a central portion, and at least one radial arm extending from said outer portion to said central portion.

30. A probe card according to claim 29, and further comprising a mount formed within said heat sink on the portion that extends on said lower testing face onto which said needle supporting module mounts.

31. A probe card according to claim 22, wherein said heat sink is formed of a metallic material.

32. A probe card according to claim 31, wherein said metallic material comprises one of copper or steel.

* * * * *